United States Patent
Laurila

(10) Patent No.: US 12,007,287 B2
(45) Date of Patent: Jun. 11, 2024

(54) TEMPERATURE CALIBRATOR WITH ADVANCED FUNCTIONALITY

(71) Applicant: Beamex Oy Ab, Pietarsaari (FI)

(72) Inventor: Heikki Laurila, Pietarsaari (FI)

(73) Assignee: Beamex Oy Ab, Pietarsaari (FI)

( * ) Notice: Subject to any disclaimer, the term of this patent is extended or adjusted under 35 U.S.C. 154(b) by 308 days.

(21) Appl. No.: 17/080,500

(22) Filed: Oct. 26, 2020

(65) Prior Publication Data
US 2021/0123821 A1     Apr. 29, 2021

(30) Foreign Application Priority Data

Oct. 28, 2019 (FI) ..................................... 20195921

(51) Int. Cl.
*G01K 15/00* (2006.01)
*G01L 27/00* (2006.01)

(52) U.S. Cl.
CPC .......... *G01K 15/005* (2013.01); *G01L 27/005* (2013.01)

(58) Field of Classification Search
CPC .............................. G01K 15/005; G01L 27/005
USPC .................................................. 374/1; 702/99
See application file for complete search history.

(56) References Cited

U.S. PATENT DOCUMENTS

| | | | | |
|---|---|---|---|---|
| 4,994,792 A * | 2/1991 | Ziegler, Jr. | ............. | G01K 3/005 340/661 |
| RE35,554 E * | 7/1997 | Pompei | ..................... | G01J 5/03 374/128 |
| 8,851,744 B1 | 10/2014 | Feller | | |
| 10,156,880 B2 | 12/2018 | Autio et al. | | |
| 2007/0290871 A1* | 12/2007 | Farley | ..................... | H05B 3/746 340/640 |
| 2010/0332179 A1* | 12/2010 | Kurtz | ..................... | G01D 15/00 702/138 |
| 2013/0049958 A1* | 2/2013 | Clement | ................ | G01D 18/00 702/6 |
| 2015/0026492 A1 | 1/2015 | Autio et al. | | |
| 2015/0134289 A1 | 5/2015 | Mrvaljevic et al. | | |

(Continued)

FOREIGN PATENT DOCUMENTS

CN      101221445        7/2008
CN      201352162 Y     11/2009
(Continued)

OTHER PUBLICATIONS

17080500_Nov. 8, 2023_FR_2920910_A1_H.pdf,Mar. 2009.*
(Continued)

*Primary Examiner* — Gail Kaplan Verbitsky
(74) *Attorney, Agent, or Firm* — Thomas | Horstemeyer, LLP

(57) ABSTRACT

The present invention combines the functionalities of a multifunctional process calibrator with a heating and/or cooling unit (also called as a dry block). The heating and/or cooling unit and the process calibrator are integrated in a single housing forming the arrangement. The arrangement allows using several digital communication protocols i.e. fieldbus protocols. Temperature sensor simulation is possible as well. Pressure measurement and/or calibration is also enabled. The arrangement is supplied with internal rechargeable battery, which enables all other functionalities without mains power, except the use of the heating and/or cooling unit, where the mains power is required.

17 Claims, 1 Drawing Sheet

(56) References Cited

U.S. PATENT DOCUMENTS

| | | | | |
|---|---|---|---|---|
| 2017/0234818 A1* | 8/2017 | Jesme | ................... | G01N 27/18 374/54 |
| 2021/0123823 A1* | 4/2021 | Byggmästar | ............ | H01L 35/32 |

FOREIGN PATENT DOCUMENTS

| | | | | |
|---|---|---|---|---|
| CN | 102507046 A | | 6/2012 | |
| CN | 105094168 A | * | 11/2015 | ........... G01K 15/002 |
| CN | 207007382 U | * | 2/2018 | |
| CN | 208488188 U | * | 2/2019 | |
| CN | 109932642 A | * | 6/2019 | |
| CN | 210533413 U | * | 5/2020 | |
| DE | 102015112255 A1 | * | 2/2017 | |
| EP | 0694774 A1 | * | 7/1994 | |
| EP | 3617680 | | 3/2020 | |
| EP | 3739314 A1 | * | 11/2020 | ........... G01K 15/002 |
| FR | 2920910 A1 | * | 3/2009 | ............ G01K 15/00 |
| JP | H07198505 A | | 8/1995 | |
| KR | 101393053 B1 | | 5/2014 | |
| KR | 101393053 B1 | * | 5/2014 | |
| RU | 2561483 C1 | * | 8/2015 | |
| RU | 2647504 C1 | * | 3/2018 | |
| SU | 857744 A1 | * | 8/1981 | |
| WO | WO-9904231 A1 | * | 1/1999 | ............ G01K 15/00 |
| WO | WO-2019052840 A1 | * | 3/2019 | ............ G01G 19/42 |

OTHER PUBLICATIONS

17080500_Nov. 8, 2023_WO_2019052840_A1_I.pdf,Mar. 2019.*
17080500_Jan. 22, 2024_EP_3739314_A1_H.pdf,Nov. 18, 2020.*
Search Report for Finnish Application No. 20195921 dated May 6, 2020.
European Search Report for Application No. 20203756.0 dated Apr. 19, 2021.
Office Action issued by the Finnish Patent Office, Finnish Application No. 20195921, dated Nov. 11, 2022.
"How to calibrate an analog temperature loop," retrieved on Nov. 8, 2022 from internet at <https://www.youtube.com/watch?v=TTnqPpfulbs>.
User Manual for Beamex MC6 Advan ced Filed Calibrator and Communicator, retrieved on Nov. 8, 2022 from internet at <https://www.beamex.com/wp-content/uploads/2017/01/MC6-User-Manual-Jan-2017.pdf>.
Field Temperature Block Series Beamex FB150, FB350, FB660 User Guide, retrieved on Nov. 8, 2022 from internet at <https://www.beamex.com.com/wp-content/uploads/2016/10/FB_User_Guide.pdf>.
Mobile Calibration System, retrieved from the internet on Nov. 8, 2022 at <https://www.web.archive.org/web/20190410223356/http://www.nagman.com/mobile-calibration-systems-kits/>.

* cited by examiner

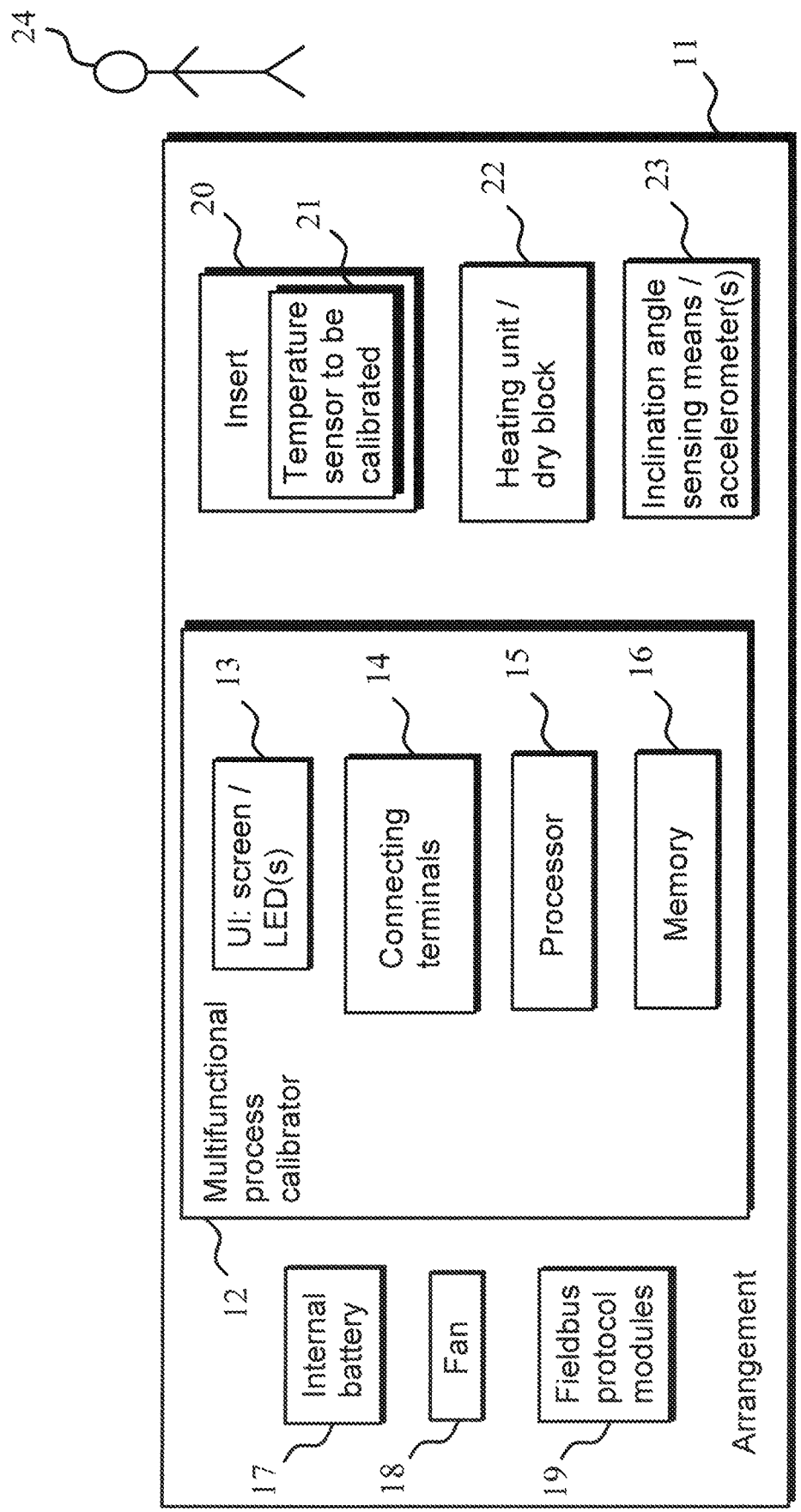

TEMPERATURE CALIBRATOR WITH ADVANCED FUNCTIONALITY

CROSS-REFERENCE TO RELATED APPLICATION

This application claims benefit of and priority to Finland Application No. 20195921, filed, Oct. 28, 2019. The entire content of which is incorporated herein by reference.

TECHNICAL FIELD

The present invention relates to an advanced temperature dry block with heating/cooling capabilities, where the dry block comprises integrated functionalities of a multifunctional process calibrator as well. In an embodiment, the present invention relates also to temperature calibrations, and such procedures applied in the advanced dry blocks, which can be widely used in various industrial processes and plants, for instance. Temperature calibrations can form only a part of all possibilities enabled by the advanced dry block.

BACKGROUND

Temperature dry blocks are versatile, multi-purpose measurement units, which can be manufactured e.g. for industrial field use, and they can be manufactured as relatively small units to be carriable around a plant or any other area, where measurements are required. Temperature dry blocks can also be called as just dry blocks or dry block calibrators or even temperature calibrators, meaning exactly the same. A main characteristic of the dry block is that it comprises heating and/or cooling element(s) which can be used to heat and, in some cases, to cool a metal block to a specific temperature and by maintaining that temperature. The created temperature is used to calibrate a temperature sensor or other related instrument. Dry blocks may be manufactured in different temperature range variations, e.g. by having a dry block which is suitable for calibrating temperatures of −25° C. . . . +150° C., and another dry block for calibrating temperatures of +50° C. . . . +660° C., to merely give some examples on different temperature range options. Many dry blocks utilize one or more interchangeable inserts into which holes are drilled. These holes may accommodate a range of temperature sensors to be calibrated. The sizes of the holes correspond to the diameters of the temperature sensors under test. Good heat transfer between an insert and a sensor is critical for accurate calibrations when using a dry block. While in the above it is said that a carriable dry block is possible, dry blocks can in principle be designed both as portable devices or as benchtop configurations.

In a high-temperature dry block, resistive heaters are typically used to heat the calibrator block and a fan is used cool down the calibrator block. Both of these are mandatory for the correct functionality of a dry block, but they act also as sources of instability. The heating elements of a high-temperature dry block are powered by mains voltage, which is not always stable, especially in an industrial environment. A fan requires an air inlet and outlet, and an air channel around the dry block, that will allow air from the surroundings to enter the space around the dry block also during the calibration process, which might cause instability in the temperature.

In a low-temperature (staying below +150° C.) dry block, Peltier elements (i.e. thermoelectric coolers, TECs) can be used to heat and cool the dry block.

In short, the dry block is a temperature calibrator which is capable in heating and cooling the sensors to be calibrated in a rather wide temperature range. A drawback of using a dry block is formed by safety hazards, which arise from the fact that the dry block may reach very high temperatures, which will make it prone to ignite fires in the worst case, or hurt the user touching the outside surface of the dry block.

In prior art, there has been developed a temperature dry block (i.e. temperature calibrator with heating/cooling elements), where communication according to HART fieldbus protocol is enabled. A drawback of this device is that such a dry block is only able to calibrate instruments, which support the HART fieldbus protocol. Thus, several calibrators each supporting different communication protocols would be needed if there are instruments to be calibrated supporting a plurality of different fieldbus protocols.

On the other hand, process calibrators are multifunctional devices which are capable to perform several types of calibrations in the field. The process calibrator can be a portable device, enabling work in the field with relative ease. The measurable quantities can be voltage, current, pressure, temperature sensors such as RTDs (i.e. resistance temperature detectors), thermocouples, frequency, and resistance, as for instance in a published product "Fluke 725 Multifunction Process Calibrator" manufactured by the US company Fluke Corporation.

As an example of a process calibrator, U.S. Pat. No. 10,156,880 (i.e. "Autio") describes one such device manufactured by Beamex Oy. Autio applies use of several fieldbus protocol units and it focuses on voltage measurements; in other words, it has functions of a fieldbus communicator. Fieldbus protocols such as HART, FOUNDATION Fieldbus and Profibus are disclosed and supported in Autio.

US patent Autio relates to a published calibrator product "MC6" by Beamex Oy, which is an advanced, high-accuracy field calibrator and communicator. Pressure, temperature and various electrical signals can be calibrated with it. It is a handheld, dust/waterproof device provided also with a touchscreen. MC6 also includes five operation modes, which are: meter, calibrator, documenting calibrator, data logger, and fieldbus communicator. Procedure can be made automated and paperless as well. The device applies rechargeable Li-ion polymer batteries. Electrical measurements can be voltage, current, frequency, pulse count, and resistance measurements, and further, resistance temperature detector (RTDs) measurements and thermocouple measurements as well with MC6. The device applies a dedicated calibration software, enabling a fully automated and paperless calibration and documentation of the results. When a certain measurement or generation is selected, the device will show in its user interface the places, where the connecting wires should be connected. Thus, a guided procedure is offered to the user as well.

A further problem in prior art solutions is that the user has been required to carry many separate devices into the field, if there is a temperature calibration, a pressure calibration, some electrical calibrations and even some further calibrations to be done. The number of required devices makes the calibration process very inpractical for the user, and also quite inconvenient and complex as well regarding the switching processes between devices and their connections into instruments to be calibrated.

SUMMARY OF THE INVENTION

In a first aspect of the present invention, it introduces an arrangement (11) configured to measure or calibrate at least a temperature sensor (21) with advanced functionalities, wherein the arrangement (11) comprises a processor (15); at least one pair of connecting terminals (14); a heating and/or cooling unit (22), comprising at least one heating and/or cooling element for heating and/or cooling a desired part of the arrangement (11); and an insert (20) configured as a place for a temperature sensor (21) to be calibrated. The arrangement is characterized in that the arrangement (11) further comprises:

- a process calibrator (12) capable of multifunctional operations and measurements; wherein
- the heating and/or cooling unit (22) and the process calibrator (12) are integrated in a single housing forming the arrangement (11).

In a second aspect of the present invention, it introduces a method for measuring or calibrating at least a temperature sensor (21) with advanced functionalities, wherein the method comprises the steps of:

- controlling an arrangement (11) by a processor (15);
- allowing connections to instruments or sensors to be measured by at least one pair of connecting terminals (14);
- performing heating and/or cooling of a desired part of the arrangement (11) by a heating and/or cooling unit (22) comprising at least one heating and/or cooling element, when desired; and
- allowing a temperature sensor (21) to be calibrated to be placed in an insert (20).

The method is characterized in that the method further comprises the steps of:

- performing at least one operation and/or measurement by a multifunctional process calibrator (12); wherein
- integrating the heating and/or cooling unit (22) and the process calibrator (12) in a single housing forming the arrangement (11).

In a third aspect of the present invention, it introduces a computer program for measuring or calibrating at least a temperature sensor (21) with advanced functionalities, the computer program comprising program code which is executable in a processor (15), wherein the computer program is configured to execute the steps of:

- controlling an arrangement (11) by the processor (15); where the arrangement (11) comprises at least one pair of connecting terminals (14) for connections to instruments or sensors to be measured, and the arrangement (11) allows a temperature sensor (21) to be calibrated to be placed in an insert (20); and
- performing heating and/or cooling of a desired part of the arrangement (11) by a heating and/or cooling unit (22) comprising at least one heating and/or cooling element, when desired.

The computer program is characterized in that the computer program is further configured to execute the step of:

- performing at least one operation and/or measurement by a multifunctional process calibrator (12); wherein the heating and/or cooling unit (22) and the process calibrator (12) are integrated in a single housing forming the arrangement (11).

Various embodiments are disclosed in dependent arrangement claims, and these features can also be applied in a corresponding method and in a corresponding computer program.

BRIEF DESCRIPTION OF THE DRAWINGS

FIG. 1 illustrates an embodiment according to the present invention, showing an arrangement comprising a dry block and a multifunctional process calibrator.

DETAILED DESCRIPTION OF THE INVENTION

The present invention addresses the drawbacks mentioned in the background, and presents an arrangement which reduces the number of required devices, and makes the calibration process much more convenient for the user.

The present invention introduces an arrangement for a versatile temperature calibration with advanced functionalities. Such an arrangement is achieved with embodiments which comprise a multifunctional process calibrator, and a dry block i.e. a temperature heat source, and certain additional features not common in the market currently.

In other words, the present invention in its many embodiments comprise a single integrated calibration device, which comprises the functionalities of a multifunctional process calibrator, and the heating and cooling operability achieved by heating and/or cooling elements of a dry block. In other words, it can be said that the present invention is an advanced temperature dry block integrated with characteristics of a multifunctional process calibrator. The dry block gives a user a possibility to heat and cool the calibrated sensor(s) to a desired stable temperature, usually via a metal block integrated in the device.

In an embodiment of the present invention, a versatile and portable automated temperature calibration arrangement is achieved by combining a multifunctional process calibrator and a dry block. A dry block is a temperature calibrator that applies heating and/or cooling to the metal block so that the metal block will reach a specific temperature and maintain that temperature. Usually the dry block may have at least one interchangeable insert, where holes are drilled. These holes can be accommodated by temperature sensors, which are to be calibrated. An important thing is that the temperature sensor close fits into the hole physically so that there is a good heat transfer between the sensor and the insert.

This arrangement is able to generate a desired temperature in a wide range by heating and/or cooling elements which can be e.g. Peltier elements or resistive heaters based on the desired temperature range. In addition to that, the arrangement is able to measure and simulate temperature, and also to measure and simulate a wide range of electrical signals provided by the multifunctional process calibrator. Also pressure measurement and calibration is possible in an embodiment of the present invention.

The arrangement is designed to be used in wide range of industrial environments, and also it is able to minimize the impact of varying environmental conditions (such as temperature or moisture levels, for instance), and variations in incoming AC power for the arrangement.

FIG. 1 illustrates a general embodiment of the arrangement 11 according to the present invention, where a multifunctional process calibrator 12 and a heating/cooling functionality of a dry block 22 are integrated together. It is notable that not all possible functional entities are shown there; only some of the common parts are shown for illustrative purposes.

The arrangement 11 comprises a multifunctional process calibrator 12, which in turn comprises a processor 15, a memory 16, a User Interface ("UI") 13 comprising a screen, LED indicators, and possibly a keyboard (or alternatively a touch screen and LED indicators), and connecting terminals for the sensor 21 to be measured or calibrated. The arrangement 11 comprises an insert 20 where the temperature sensor 21 to be calibrated can be placed. The heating and/or cooling unit 22 comprising heating and/or cooling element(s) is a relevant part of the arrangement 11. Furthermore, there can be an accelerometer 23 for measuring an inclination angle of the device (i.e. the arrangement housing). Such sensing means 23 is also capable to detect a full tipping of the device over its side. There is an internal, rechargeable battery 17, a fan 18 and a plurality of fieldbus protocol modules 19 (at least two of them). In an embodiment, there are three different fieldbus protocol modules. The arrangement 11 can be used in the field by the user 24. There can also be an external computer in a control room (not shown), where measurement/calibration data can also be shown, analyzed and stored.

Many alternative and additional functional modules are possible, and they are disclosed elsewhere in this description.

The arrangement is provided with a modern user interface, which in an embodiment is a touch screen providing multi-color information, multilingual instructions possibilities, and graphical and numerical viewing possibilities. This results in an easy and enjoyable user experience. The touch screen is built so that it is able to receive accurate input data, no matter whether the user is using bare fingers, hands with gloves or some form of a stylus.

In an embodiment, the arrangement is configured to provide support for a plurality of digital fieldbus protocols and corresponding communication principles. These functionalities can be integrated in the manufactured arrangement e.g. in a form of parallel modules, each applying a dedicated fieldbus protocol. In an embodiment, the supported fieldbus protocols are at least two from the group of HART, FOUNDATION Fieldbus and Profibus fieldbus protocols. An imminent advantage of using a plurality of supported fieldbus protocols is that a single arrangement allows calibrating a group of instruments which communicate under more than one fieldbus protocol, without a need to use two or more separate calibrator devices for all the calibrations.

The arrangement according to the invention can be considered as "a mobile calibration laboratory", which replaces a large number of conventional, separate single-function calibration devices. Thus, the arrangement is a compact solution, allowing the user to carry it easily with him/her in the field environment (such as a plant, factory or automation line). This is a great advantage of the presented arrangement.

In an embodiment, the heating and cooling processes by the dry block are designed so that there are no overshoots even in the case where the heating and cooling speed is relatively large. This improves efficiency and shortens the measurement and calibration times. The maximum velocity for the rate of change of the temperature can be set by the user.

In an embodiment, the process calibrator according to the arrangement comprises a plurality of resistance (R) or RTD measurement channels, and a plurality of thermocouple measurement channels. In a more detailed embodiment, the number of the resistance/RTD measurement channels can be three, and the number of thermocouple measurement channels can be two. There can also be connection(s) for measuring and/or generating various DC electrical signals.

In an embodiment, the arrangement comprises an ability to create a simulated temperature sensor signal. Such a need often arises when a temperature sensor is calibrated in the dry block of the arrangement, in connection of calibrating temperature measurement loops and/or instruments. In this situation, it is common that a signal created by a temperature sensor needs to be fed into a measurement circuit. This embodiment creates a simulated temperature sensor signal, which can be fed to an appropriate location in one or more measurement circuits. In an embodiment, the presented arrangement simulates signals based on an RTD (i.e. resistance temperature detector) or from a thermocouple measurement, and the arrangement can forward it to a desired place in a measurement circuit (or simulate several signals and feed them to a plurality of desired locations). In other words, the temperature sensor signal simulation means that a sensor is "mimicked" and the simulation means generates an appropriate resistance value (concerning a RTD sensor) or voltage value (concerning a thermocouple) so that it corresponds to the sensor's "output" when the sensor is placed in that particular temperature. In practice, the simulation means works so that the user may input a temperature value (i.e. a temperature input value) to a simulating device, e.g. 100° C., and the simulating device will simulate a correct resistance or voltage, which the sensor would output, if it located in that particular inputted temperature (i.e. in the temperature input value). An advantage of this embodiment is that the dry blocks according to the prior art have not been capable of doing this. A further advantage is that the user does not have to carry a separate device for the sensor simulation.

In an embodiment, the arrangement can be connected to an external pressure module which can be used for various pressure measurements and calibrations. This is very useful for a calibration technician, because temperature calibrations are very often accompanied with a need to perform also pressure calibrations. In practice, there can be either a multivariable process transmitter which measures both temperature and pressure, or there can be several distinct temperature or pressure sensing devices which need to be calibrated. With such an external pressure module, the sensors measuring these two quantities can be calibrated with a single arrangement. In prior art, there has not been presented a dry block which would be able to measure or calibrate pressure as well; or at least this has been unheard of. With the presented embodiment, a single arrangement i.e. device is able to measure and calibrate both temperature sensors and pressure sensors; relieving the amount of carrying equipment in the field by the calibrator user. This is a further practical advantage of this embodiment.

In an embodiment, the arrangement comprises a battery which is internal and rechargeable from 220 V mains voltage. Of course, the same functionality may be enabled with using at least two batteries as well. In an embodiment, the battery allows using the various features of the arrangement when the mains voltage is not available for some reason, except for the heating and/or cooling elements (embodied with Peltier elements or resistive heating elements, for instance) which would require the use of the mains voltage because of a higher required power. This means that a desired mode of the arrangement may be used without mains power connection, such as e.g. the measurements by the process calibrator, the field communicator functionality or communication according to the calibration software between the calibrator and the external computer in the control room of the factory. In prior art, dry blocks in the market require a mains AC voltage input as a power supply for every functionality they support. Instead, with the presented embodiment of the invention, all functionalities, except the heaters, may be operated by taking the power from the internal battery. This makes the usage and the workplace selections much more free, because it is not always necessary to find a mains AC 220 V input for the arrangement to work. This gives flexibility for the use situations of the arrangement.

The arrangement may execute all the performed settings, method steps, measurements, calibrations and data transmissions/receptions by applying a calibration software. The calibration software can work in co-operation with the operations available in a control room, or generally, in an external computer used by e.g. a manager of the measurement/calibration actions. The common calibration software enables calibration processes, where work orders may be supplied by the manager, and received by the process calibrator, where the user can view them on the screen. When the measurements and/or calibrations according to the work order have been completed, the calibration software enables the results to be sent back to the control room (or to other external computer or server). The measurements, savings and data transmissions can be implemented as an automated process, after the measurement scheme and the settings have been input or otherwise selected by the user or the manager. Electronic signatures or passwords can be enabled for user identification, and the transmitted data can also be protected with an appropriate encoding/decoding method for protecting data against data tampering or unauthorized access. When the measurement and/or calibration data is received by the control room equipment, the data can be set for viewing, analysis or storage in an appropriate server. Thus, the results can be accessed later anytime. The advantage of the calibration software is a fully paperless process concerning the calibrations and reporting of the calibration results.

Concerning different fieldbus protocols, the arrangement may provide all required loop supply and impedances concerning communication according to a given fieldbus protocol. Thus, according to the needed fieldbus protocol, the user may select and activate a desired module relating to the selected fieldbus protocol, and there is no need for extra devices or functional modules in order to communicate from the field.

The arrangement according to the present invention is provided with a plurality of safety features. The main safe concern arises from large heat which is possible during use of a dry block, and the temperature may be even up to +660° C. In an embodiment, the arrangement may output a red indicator light in the front face or on the screen of the process calibrator or the dry block, which will turn on, when the temperature of the dry block exceeds a predetermined temperature limit indicative dangerously hot measurement unit. In an embodiment, the hot unit may be informed to the user by both giving a red indicator light (e.g. through a LED) on top of the dry block, and additionally on the screen of the process calibrator.

In an embodiment, the safety features comprise applying an accelerometer in the dry block for detecting an inclination (i.e. tilt) angle of the dry block compared to an upright position. If the inclination angle exceeds a predetermined inclination threshold angle, the arrangement will warn the user that the calibration accuracy can be jeopardized through too large inclination angle. Furthermore, when the threshold is exceeded, also the heating and/or cooling elements can be switched off and a fan of the dry block can be also switched on then. In the rare case of the dry block totally tipping over to its side for some reason, the same actions can be performed: Switch off the heaters and turn on the fan for quick cooling of the device, and thus, the ignition probability of a fire can be minimized.

In an embodiment, the arrangement may apply a functionality where it may calibrate sensors which are physically short or used in sanitary applications, such as in food, beverage or pharmaceutical industries. Many sensors in sanitary application may comprise a flange. This requires a dedicated type of insert, a very short reference sensor and a flexible cable for that sensor. Then, the cover of the dry block comprises groves meant for the reference sensor cable. This structure allows an accurate calibration of a sensor provided with a flange.

In an embodiment, the arrangement comprises a possibility to connect the arrangement to an external temperature controller or an external pressure controller. Thereafter, the communication between such entities is enabled. In this way, it is possible to e.g. extend the applicable temperature range if the currently used dry block allows a temperature range not enough for the desired use situation. The use of the external pressure controller allows calibrating e.g. various pressure instruments in the field by using the multifunctional process calibrator.

In an embodiment, the reference sensors used in the arrangement comprise a memory chip which is configured to store the sensor coefficients. The arrangement is configured to automatically read and use these coefficients when the reference sensor is inserted into the arrangement. This ensures correct temperature measurements each time the measurement is performed. Such a reference temperature sensor can be called as a smart reference temperature sensor. In a further embodiment, the smart reference temperature sensor is implemented as a straight sensor, and in another embodiment, the smart reference temperature sensor is implemented as a bent sensor. The latter embodiment allows convenient calibration of sensors with connection heads.

A main advantage of the arrangement according to the present invention derives from the fact that the device is a multifunctional tool integrated to a compact solution. Thus, it is a very versatile system. It provides excellent accuracy and metrological performance as well. The arrangement will replace a large number of conventional, and separate single-functioned devices. The arrangement in an embodiment comprises a dry block, a temperature calibrator, an electrical calibrator, a pressure calibrator, a multi-bus field communicator, a loop supply, and a note pad as well, thus providing an extensive number of different functionalities. All this can be implemented in a singular housing, which is well carriable by a worker in the field. The device to be carried thus weighs less and it is easier and more convenient to carry and keep with the worker in the field without e.g. risk of forgetting one of the several required devices. Thus, the integrated arrangement is very practical in industrial use situations in the field, and it has great usability. A multi-bus field communicator provides accessibility with different kinds of instrumentation. Finally, an automated documenting functionality obtained by the calibration software enables a full digitalization of the calibration process, which saves paper, and removes the possibility of missing documents in a paper form in the field. This enhances the usability experience even more.

It is possible to combine separate features disclosed above and in the dependent claims so that any two or more features are applied in common in the invented arrangement. In an embodiment, there are four main features which are interconnectable with any combination comprising two, three or all of them. These four main features are the digital fieldbus protocols, temperature sensor simulation, pressure measurement and the internal rechargeable battery (or batteries).

Thus, the present invention is discussed through three different aspects, namely an arrangement, a method and a computer program (and a computer program product, correspondingly), all desired to measure or calibrate at least a temperature sensor with advanced functionalities.

The present invention is not restricted merely to embodiments presented above, but the present invention may vary within the scope of the claims.

The invention claimed is:

1. An arrangement for calibrating a temperature sensor applying a dry block, wherein the arrangement comprises:
    a processor;
    at least one pair of connecting terminals;
    a heating and cooling unit, comprising at least one heating and cooling element for heating and/or cooling a desired part of the arrangement;
    an insert providing a place for a temperature sensor to be calibrated,
        wherein the arrangement further comprises:
    a multifunctional process calibrator performing operations, measurements and generations concerning at least two different quantities taken from a group of voltage, current, pressure, temperature, frequency, and resistance; wherein
    the heating and cooling unit and the multifunctional process calibrator are integrated in a single housing forming the arrangement, wherein the arrangement comprises:
    an internal, rechargeable battery, which provides power to the arrangement except for the use of the at least one heating and cooling element; and
    an accelerometer for detecting an inclination angle of the arrangement, and if the inclination angle exceeds a threshold angle, relaying a warning to a user of the arrangement.

2. The arrangement according to claim 1, wherein the at least one heating and cooling element is a Peltier element or a resistive heating element, depending on a desired temperature area of the arrangement.

3. The arrangement according to claim 1, wherein the arrangement comprises a user interface, comprising LED indicators, a screen, and a keyboard, where the LED indicators show warning signals to a user, and a screen shows connection instructions relating to the at least one pair of connecting terminals to the user relating to a desired calibration.

4. The arrangement according to claim 1, wherein the arrangement comprises at least two different fieldbus protocol modules enabling communication in at least two different fieldbus protocols.

5. The arrangement according to claim 4, wherein the fieldbus protocols are selected among a group of HART, FOUNDATION Fieldbus and Profibus fieldbus protocols.

6. The arrangement according to claim 1, wherein the arrangement comprises:
    a temperature sensor signal simulation which creates a temperature sensor signal based on a temperature input value, and which feeds the created temperature sensor signal to a desired location in a measurement circuit in the field.

7. The arrangement according to claim 1, wherein the arrangement comprises a pressure measurement module which measures or calibrates pressure of a pressure sensor.

8. The arrangement according to claim 1, wherein the multifunctional process calibrator comprises:
    a plurality of resistance (R) or resistance temperature detector (RTD) measurement channels, and
    a plurality of thermocouple measurement channels.

9. The arrangement according to claim 1, wherein the arrangement executes performed settings, method steps, measurements, calibrations, and data transmission/receptions by applying a calibration software, which is common in the multifunctional process calibrator and in an external computer used in a control room, allowing data flow between the arrangement and the external computer, and measurement/calibration data storage to a desired location.

10. The arrangement according to claim 3, wherein the arrangement informs excessive heat within the arrangement with a warning indicator via the LED or via the screen.

11. The arrangement according to claim 1, wherein the arrangement comprises a connection to an external temperature controller or to an external pressure controller.

12. The arrangement according to claim 1, wherein the arrangement comprises reference sensors, which comprise a memory chip to store sensor coefficients, and wherein
    the arrangement automatically reads and uses the sensor coefficients after the insertion of the reference sensors into the arrangement.

13. A method for calibrating a temperature sensor applying a dry block, wherein the method comprises the steps of:
    controlling an arrangement by a processor;
    allowing connections to instruments or sensors to be measured by at least one pair of connecting terminals;
    performing heating and/or cooling of a desired part of the arrangement by a heating and cooling unit comprising at least one heating and cooling element, when desired;
    placing a temperature sensor in an insert for calibration,
        wherein the method further comprises the steps of:
    performing at least one operation and/or measurement and/or generation by a multifunctional process calibrator, where the multifunctional process calibrator is performing operations, measurements and generations concerning at least two different quantities taken from a group of voltage, current, pressure, temperature, frequency, and resistance; wherein
    integrating the heating and cooling unit and the multifunctional process calibrator in a single housing forming the arrangement, wherein the arrangement comprises:
    an internal, rechargeable battery, which provides power to the arrangement except for the use of the at least one heating and cooling element; and
    an accelerometer for detecting an inclination angle of the arrangement, and if the inclination angle exceeds a threshold angle, relaying a warning to a user of the arrangement.

14. A non-transient computer memory with a computer program for calibrating a temperature sensor applying a dry block, the computer program comprising program code which is executable in a processor, wherein the computer program executes the steps of:
    controlling an arrangement by the processor; where the arrangement comprises at least one pair of connecting terminals for connections to instruments or sensors to be measured, and the arrangement allows a temperature sensor to be placed in an insert for calibration;
    performing heating and/or cooling of a desired part of the arrangement by a heating and cooling unit comprising at least one heating and cooling element, when desired;
    wherein the computer program further executes the step of:

performing at least one operation and/or measurement and/or generation by a multifunctional process calibrator, where the multifunctional process calibrator is performing operations, measurements and generations concerning at least two different quantities taken from a group of voltage, current, pressure, temperature, frequency, and resistance; wherein the heating and cooling unit and the multifunctional process calibrator are integrated in a single housing forming the arrangement, wherein the arrangement comprises:

an internal, rechargeable battery, which provides power to the arrangement except for the use of the at least one heating and/or cooling element; and an accelerometer for detecting an inclination angle of the arrangement, and if the inclination angle exceeds a threshold angle, relaying a warning to a user of the arrangement.

15. An arrangement for calibrating a temperature sensor applying a dry block, wherein the arrangement comprises:
a processor;
at least one pair of connecting terminals;
a heating and cooling unit, comprising at least one heating and cooling element for heating and/or cooling a desired part of the arrangement;
an insert providing a place for a temperature sensor to be calibrated,
wherein the arrangement further comprises:
a multifunctional process calibrator performing operations, measurements and generations concerning at least two different quantities taken from a group of voltage, current, pressure, temperature, frequency, and resistance; wherein
the heating and cooling unit and the multifunctional process calibrator are integrated in a single housing forming the arrangement;
wherein the arrangement comprises a user interface, comprising LED indicators, a screen, and a keyboard, where the LED indicators show warning signals to a user, and a screen shows connection instructions relating to the at least one pair of connecting terminals to the user relating to a desired calibration; wherein the arrangement informs excessive heat within the arrangement with a warning indicator via the LED or via the screen; wherein the arrangement further comprises:
an accelerometer, which senses whether an inclination angle of the arrangement exceeds a threshold angle or whether the arrangement has tipped over to its side, and
a fan, wherein the arrangement switches off the heating and cooling elements and turns on the fan.

16. A method for calibrating a temperature sensor applying a dry block, wherein the method comprises the steps of:
controlling an arrangement by a processor;
allowing connections to instruments or sensors to be measured by at least one pair of connecting terminals;
performing heating and/or cooling of a desired part of the arrangement by a heating and cooling unit comprising at least one heating and cooling element, when desired;
placing a temperature sensor in an insert for calibration, wherein the method further comprises the steps of:
performing at least one operation and/or measurement and/or generation by a multifunctional process calibrator, where the multifunctional process calibrator is performing operations, measurements and generations concerning at least two different quantities taken from a group of voltage, current, pressure, temperature, frequency, and resistance; wherein
integrating the heating and cooling unit and the multifunctional process calibrator in a single housing forming the arrangement;
wherein the arrangement comprises a user interface, comprising LED indicators, a screen, and a keyboard, where the LED indicators show warning signals to a user, and a screen shows connection instructions relating to the at least one pair of connecting terminals to the user relating to a desired calibration;
wherein the arrangement informs excessive heat within the arrangement with a warning indicator via the LED or via the screen; wherein the arrangement further comprises:
an accelerometer, which senses whether an inclination angle of the arrangement exceeds a threshold angle or whether the arrangement has tipped over to its side, and
a fan, wherein
the arrangement switches off the heating and cooling elements and turns on the fan.

17. A non-transient computer memory with a computer program for calibrating a temperature sensor, the computer program comprising program code which is executable in a processor, wherein the computer program executes the steps of:
controlling an arrangement by the processor; where the arrangement comprises at least one pair of connecting terminals for connections to instruments or sensors to be measured, and the arrangement allows a temperature sensor to be placed in an insert for calibration;
performing heating and/or cooling of a desired part of the arrangement by a heating and cooling unit comprising at least one heating and cooling element, when desired; wherein the computer program further executes the steps of:
performing at least one operation and/or measurement and/or generation by a multifunctional process calibrator, where the multifunctional process calibrator is performing operations, measurements and generations concerning at least two different quantities taken from a group of voltage, current, pressure, temperature, frequency, and resistance; wherein
the heating and cooling unit and the multifunctional process calibrator are integrated in a single housing forming the arrangement;
wherein the arrangement comprises a user interface, comprising LED indicators, a screen, and a keyboard, where the LED indicators show warning signals to a user, and a screen shows connection instructions relating to the at least one pair of connecting terminals to the user relating to a desired calibration;
wherein the arrangement informs excessive heat within the arrangement with a warning indicator via the LED or via the screen; wherein the arrangement further comprises:
an accelerometer, which senses whether an inclination angle of the arrangement exceeds a threshold angle or whether the arrangement has tipped over to its side, and
a fan, wherein
the arrangement switches off the heating and cooling elements and turns on the fan.

* * * * *